(12) United States Patent
Ma

(10) Patent No.: US 6,731,516 B1
(45) Date of Patent: May 4, 2004

(54) LAND GRID ARRAY CONNECTOR HAVING MOVABLE ENGAGEMENT OF ELECTRICAL CONTACTS THEREINTO

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/448,050

(22) Filed: May 28, 2003

(30) Foreign Application Priority Data

Mar. 21, 2003 (TW) .................................... 092204446 U

(51) Int. Cl.[7] ................................................ H05K 7/14
(52) U.S. Cl. ........................ 361/802; 361/785; 439/66; 439/71
(58) Field of Search ................................ 361/728, 732, 361/736, 742, 743, 752, 753, 758, 759, 769, 785, 798, 799, 801, 802; 439/66, 70, 71, 74, 862

(56) References Cited

U.S. PATENT DOCUMENTS 5,653,598 A * 8/1997 Grabbe ........................ 439/66
6,146,152 A * 11/2000 McHugh et al. ............... 439/66
6,203,331 B1 * 3/2001 McHugh et al. ............... 439/71
6,210,176 B1 * 4/2001 Hsiao
6,220,870 B1 * 4/2001 Barabi et al. .................. 439/71

* cited by examiner

*Primary Examiner*—David Martin
*Assistant Examiner*—Thanh S. Phan
(74) *Attorney, Agent, or Firm*—Wei Te Chung

(57) ABSTRACT

An LGA connector (1) includes a housing (2), and a number of contacts (3) received in the housing. The housing defines a cavity (23) in a middle thereof for receiving a CPU (7) and a multiplicity of passageways (231) in a portion thereof under the cavity, and has a number of stand-offs (220) at a bottom surface thereof. Each passageway includes a slot (2312). Each contact comprises an engaging portion (33) movably engaging in the corresponding slot, a long arm (31) accommodated within the passageway, and a solder portion (32) engaging a PCB (5). In use, the CPU is pressed downwardly to press the housing downwardly. The engaging portion of each contact slides upwardly in the slot. The stand-offs of the housing attach on the PCB, and the long arm of each contact deforms elastically to contact the CPU. The LGA connector thus electrically connects the CPU with the PCB.

3 Claims, 7 Drawing Sheets

LAND GRID ARRAY CONNECTOR HAVING MOVABLE ENGAGEMENT OF ELECTRICAL CONTACTS THEREINTO

BACKGROUND OF THE INVENTION

1. Field of the Invention

The present invention relates to land grid array (LGA) connectors, and particularly to an LGA connector for electrically connecting an electronic package such as an LGA central processing unit (CPU) with a circuit substrate such as a printed circuit board (PCB), wherein the LGA connector movably engages a number of electrical contacts therein.

2. Description of the Prior Art

At present, LGA connectors are widely used to electrically connect LGA CPUs with PCBs. A typical LGA connector is disclosed in Taiwan Patent No. 444960. Referring to FIGS. 8 through 10, a conventional LGA connector 6 comprises an insulative housing 61, and a multiplicity of electrical contacts 62 received in the housing 61. The housing 61 is substantially rectangular, and defines a rectangular cavity 63 in a middle thereof for receiving an LGA CPU 8 therein. A portion of the housing 61 under the cavity 63 defines a multiplicity of passageways 631 therethrough. Each passageway 631 includes a pair of aligned slots 6310 in a middle thereof. The contacts 62 engage with the housing 61 in the corresponding slots 6310 of the passageways 631, respectively. Each contact 62 comprises an engaging portion 623, a contact portion 621 extending from an end of the engaging portion 623, and a solder portion 622 extending from another end of the engaging portion 623. A solder ball 624 is electrically mounted to the solder portion 622 by welding. The engaging portion 623 has a number of protrusions 6230. The protrusions 6230 of the contacts 62 interferentially engage the housing 61 at the corresponding slots 6310, such that the contacts 62 are secured in the housing 61. The contact portions 621 protrude out from a top surface 610 of the housing 61, and the solder balls 624 project down beyond a bottom surface 611 of the housing 61. Therefore, the contact portions 621 are liable to be accidentally damaged, particularly during shipping of the LGA connector 6.

In use, the LGA connector 6 is mounted to a PCB 9, with the solder balls 624 electrically connected with the PCB 9. The CPU 8 is mounted in the cavity 63 of the LGA connector 6. A force is applied to press the CPU 8 downwardly. Such force may be transmitted by another component such as a retention module (not shown). The contact portions 621 of the contacts 62 deform elastically such that the contact portions 621 firmly electrically connect with the CPU 8. The LGA connector 6 thus electrically connects the CPU 8 with the PCB 9. In this state, the solder balls 624 of the LGA connector 6 sustain the pressure applied from the retention module, and the solder balls 624 are liable to be damaged thereby. When any one or more of the solder balls 624 are damaged, the electrical connection between the CPU 8 and the PCB 9 is liable to be disrupted.

In view of the above, a new LGA connector that overcomes the above-mentioned disadvantages is desired.

SUMMARY OF THE INVENTION

Accordingly, an object of the present invention is to provide a land grid array (LGA) connector for electrically connecting an LGA central processing unit (CPU) with a printed circuit board (PCB), and particularly to an LGA connector which can be safely shipped.

Another object of the present invention is to provide a land grid array (LGA) connector for electrically connecting an LGA central processing unit (CPU) with a printed circuit board (PCB), and particularly to an LGA connector which has a housing configured to minimize the risk of solder balls being broken in use.

To achieve the above-mentioned objects, an LGA connector in accordance with a preferred embodiment of the present invention comprises an insulative housing, and a multiplicity of electrical contacts received in the housing. The housing is substantially rectangular, and has a plurality of stand-offs at a bottom surface thereof. Two aligned of the stand-offs at one side of the bottom surface are parallel to another of the stand-offs at an opposite side of the bottom surface. A rectangular cavity is defined in a middle of the housing for receiving an LGA CPU therein. A multiplicity of passageways is defined in a portion of the housing under the cavity. Each passageway includes a slot at an end thereof. The contacts engage with the housing in the slots respectively. Each contact comprises an engaging portion for engaging in the slot of one of passageways of the housing, a contact portion accommodated within the passageways, and a solder portion. A solder ball is mounted to the solder portion for electrically connecting with a PCB by welding. In use, a force is applied to press the CPU downwardly. The CPU presses the housing downwardly, and the engaging portion of each contact slides upwardly in the corresponding slot relative to the housing until the stand-offs make contact with a top surface of the PCB. The contact portion deforms elastically to firmly electrically connect with the CPU. The LGA connector thus reliably electrically connects the CPU with the PCB.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
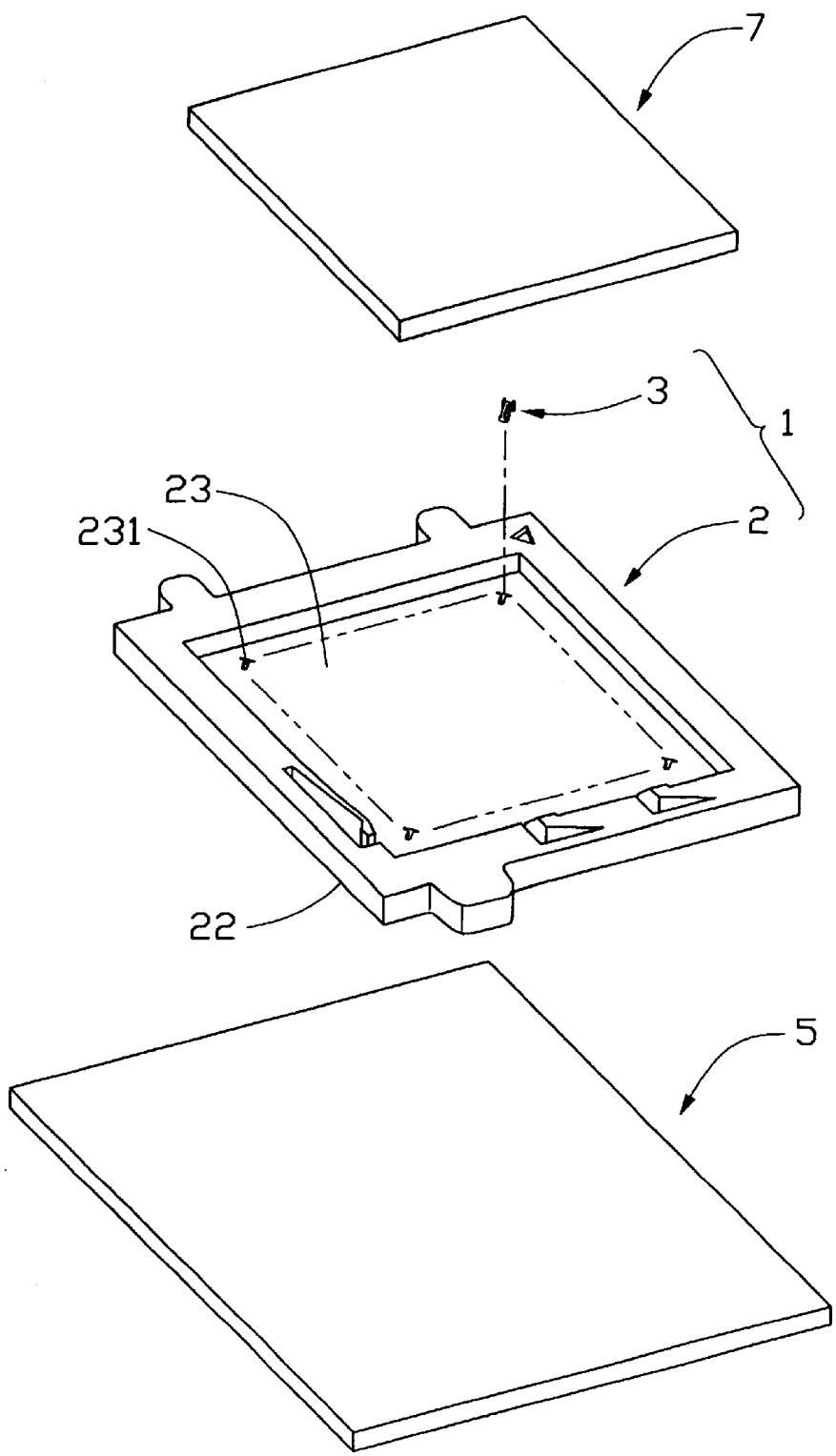
FIG. 1 is a simplified, exploded isometric view of an LGA connector of the present invention, together with an LGA CPU and a PCB.
Figure 2:
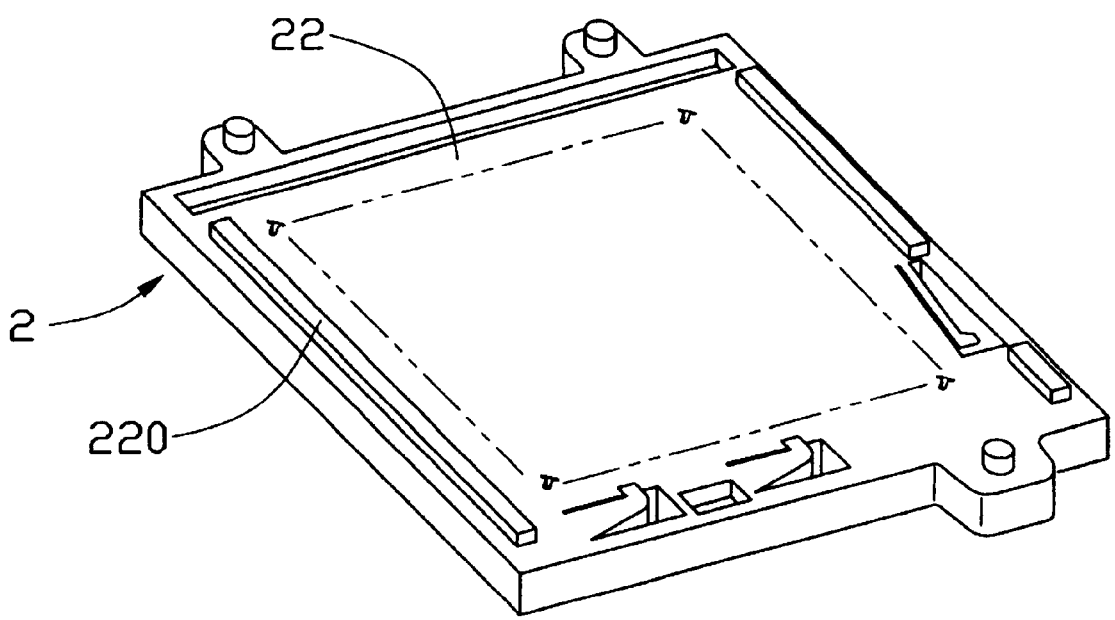
FIG. 2 is an isometric view of a housing of the LGA connector of FIG. 1, but showing the housing inverted.
Figure 3:
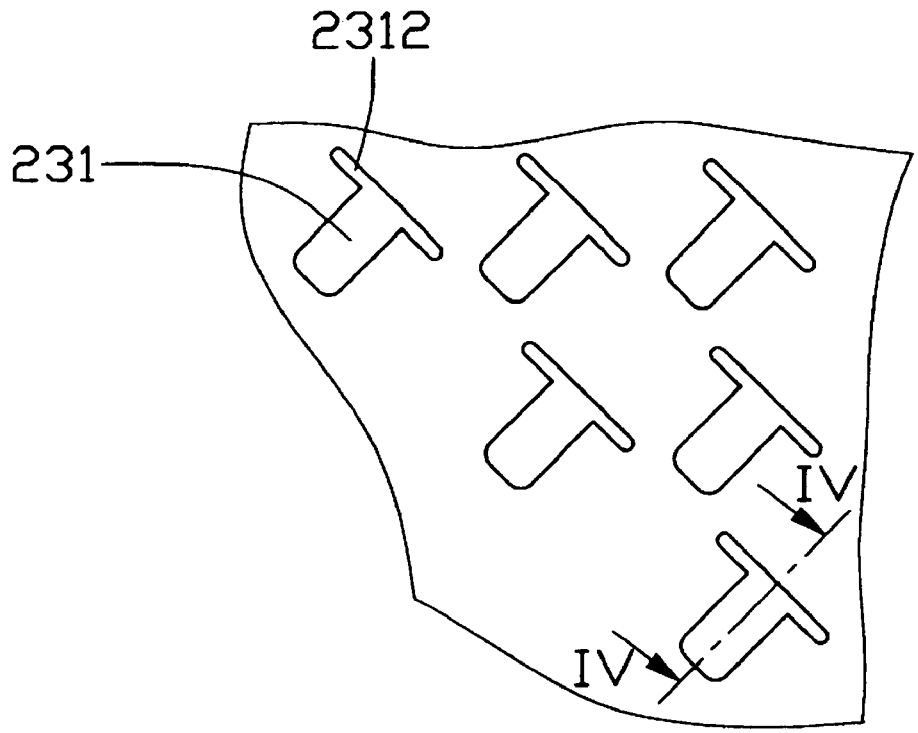
FIG. 3 is an enlarged, top elevation view of part of the housing of the LGA connector of FIG. 1.
Figure 4:
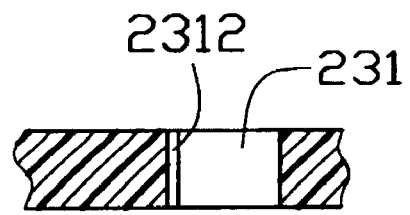
FIG. 4 is a cross-sectional view taken along IV—IV line of FIG. 3.
Figure 5:
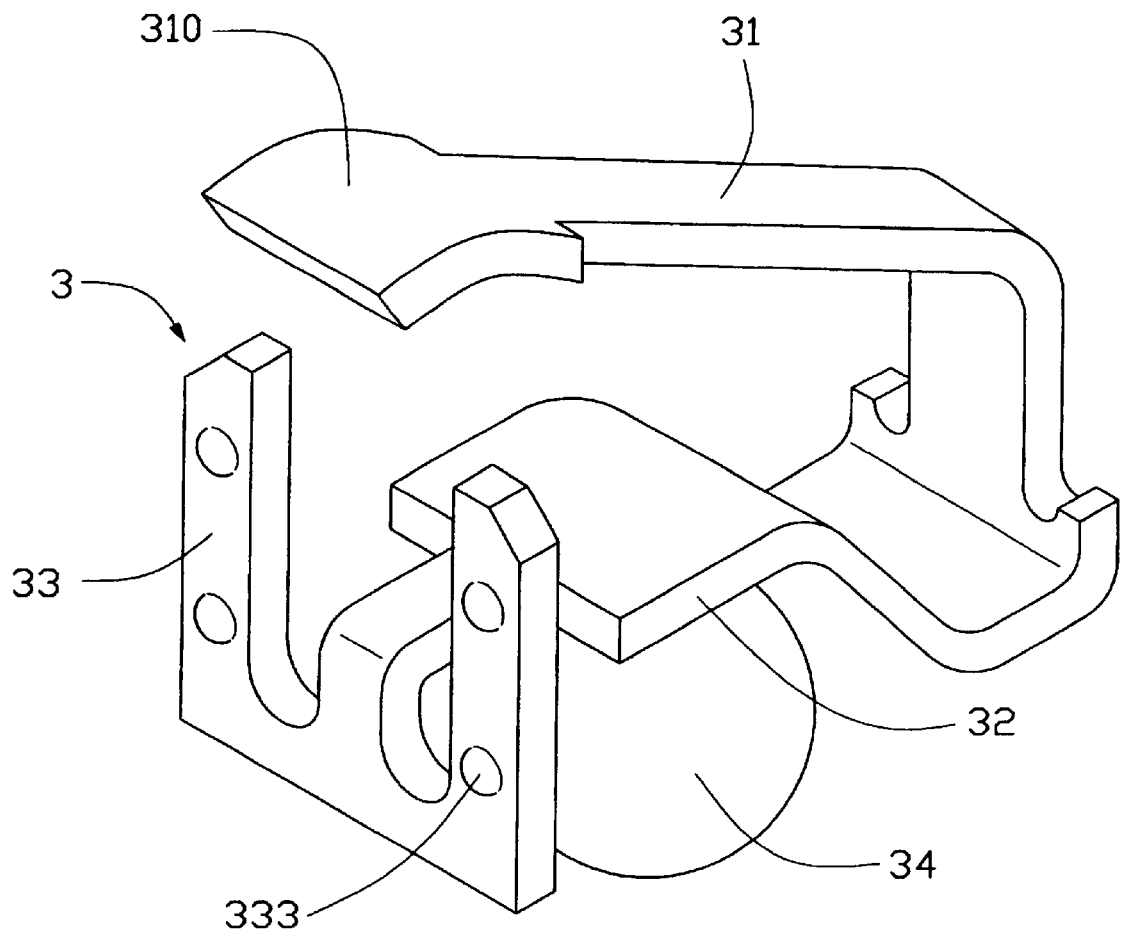
FIG. 5 is an enlarged, isometric view of one contact of the LGA connector of FIG. 1.

Referring to FIG. 1, a land grid array (LGA) connector 1 of the present invention is used for electrically connecting an electronic package such as an LGA central processing unit (CPU) 7 with a circuit substrate such as a printed circuit board (PCB) 5.

Also referring to FIGS. 2 through 5, the LGA connector 1 comprises an insulative housing 2, and a multiplicity of electrical contacts 3 received in the housing 2. The housing 2 is substantially rectangular, and defines a rectangular cavity 23 in a middle thereof and a multiplicity of passageways 231 in a portion thereof under the cavity 23. Each passageway 231 includes a slot 2312 at an end thereof. Three stand-offs 220 are formed at two opposite sides of a bottom surface 22 of the housing 2. Two aligned of the stand-offs 220 at one side of the bottom surface 22 are parallel to another of the stand-offs 220 at the opposite side of the bottom surface 22. Each contact 3 comprises an engaging portion 33, a solder portion 32 extending from the engaging portion 33, and a long arm 31 extending from the solder portion 33. A solder ball 34 is mounted to the solder portion 32 by welding, for electrically connecting with the PCB 5. The engaging portion 33 has a plurality of protrusions 333 formed on an outer main face thereof. The long arm 31 has a contact portion 310 at a free end thereof, for electrically connecting with the CPU 7.

Figure 6:
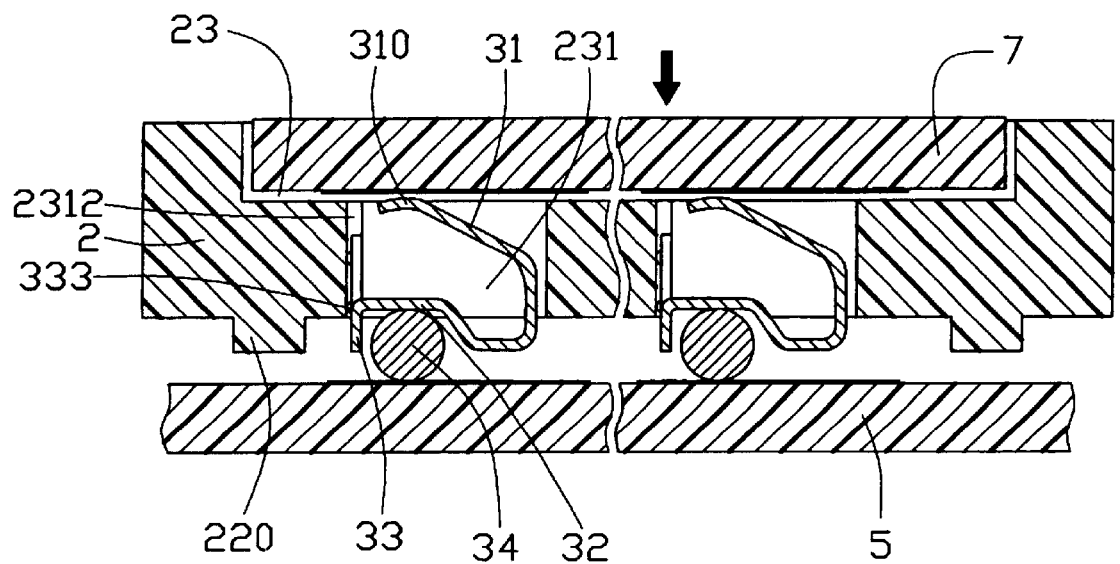
FIG. 6 is a simplified, cross-sectional view of the components of FIG. 1 being assembled together, showing the LGA connector assembled and mounted on the PCB, and the CPU ready to be connected with contacts of the LGA connector.

Referring also to FIG. 6, when the contacts 3 are received in the passageways 231 of the housing 2, an upper section of the engaging portion 33 of each contact 3 engages with the housing 2 at a lower section of a corresponding slot 2312, due to friction between the protrusions 333 and a main wall of the housing 2 at the slot 2312. The long arm 31 is substantially accommodated within the passageway 231, and the solder ball 34 projects down beyond a plane defined by the stand-offs 220. Therefore, the long arms 31 of the contacts 3 are protected from being accidentally damaged, particularly during shipping of the LGA connector 1.

Figure 7:
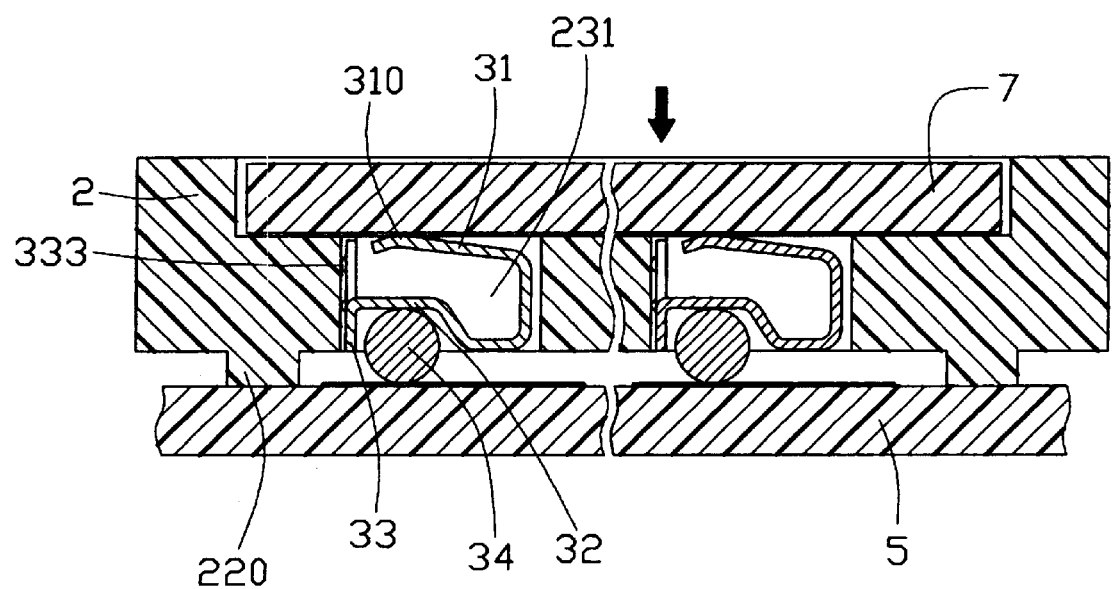
FIG. 7 is similar to FIG. 6, but showing the CPU electrically connecting with the contacts, and stand-offs of the LGA connector attached on the PCB.
Figure 8:
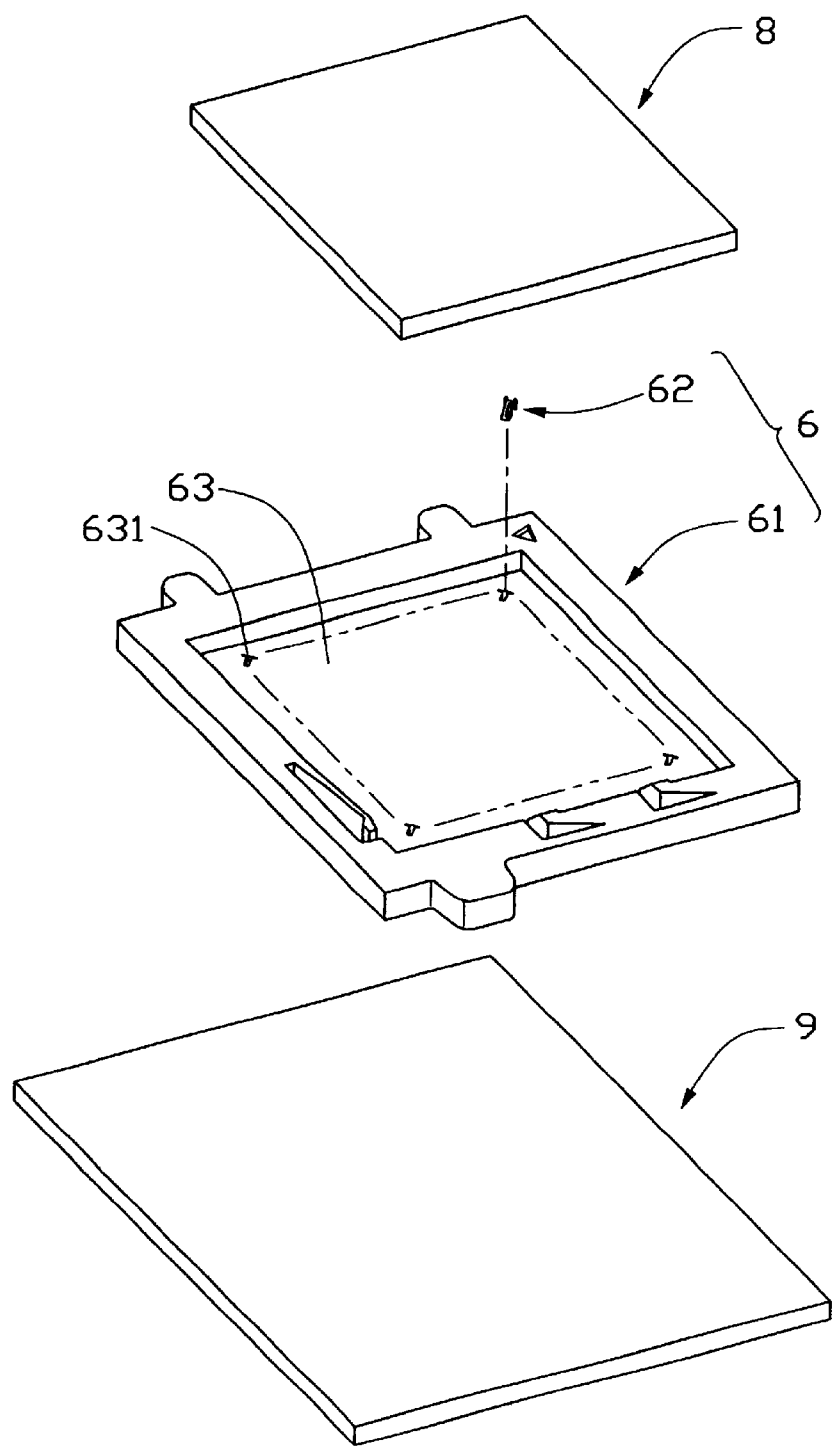
FIG. 8 is a simplified, exploded isometric view of a conventional LGA connector together with an LGA CPU and a PCB, the LGA connector comprising a housing and a plurality of electrical contacts (only one shown)
Figure 9:
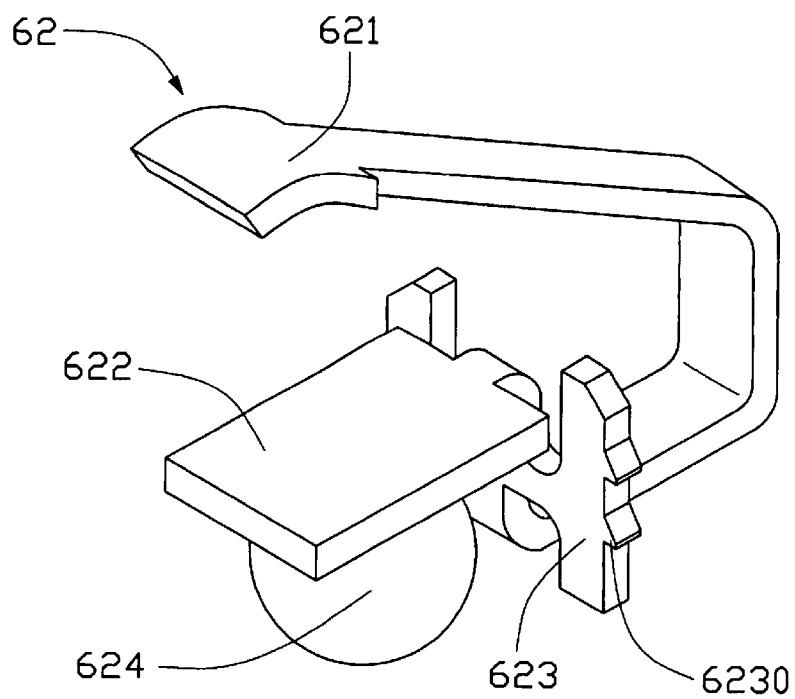
FIG. 9 is an enlarged, isometric view of one contact of the LGA connector of FIG. 8.
Figure 10:
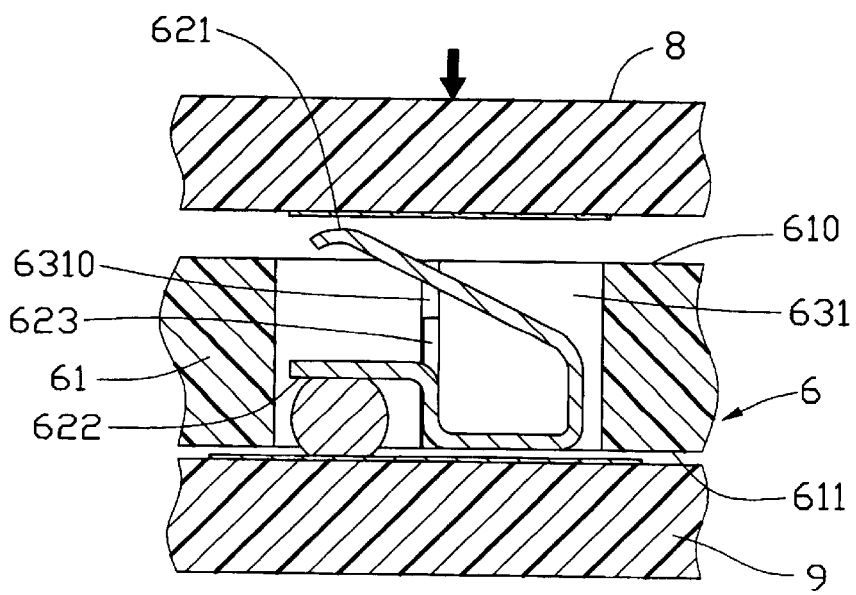
FIG. 10 is a cross-sectional view of parts of the components of FIG. 9 being assembled together, showing the LGA connector assembled and mounted on the PCB, and the CPU ready to be connected with contacts of the LGA connector.

Referring to FIGS. 6 and 7, in use, the LGA connector 1 is mounted on the PCB 5, with the solder balls 34 welded to and electrically connected with a top surface of the PCB 5, and the stand-offs 220 of the housing 2 disposed above the PCB 5. The CPU 7 is mounted in the cavity 23 of the housing 2. A force is applied to press the CPU 7 downwardly. Such force may be transmitted by another component such as a retention module (not shown). The CPU 7 presses the housing 2 downwardly, and the engaging portion 33 of each contact 3 slides upwardly in the corresponding slot 2312. The stand-offs 220 of the housing 2 make contact with the PCB 5, and the engaging portion 33 of the contact 3 engages in an upper section and the lower section of the slot 2312 of the passageway 231. The long arm 31 of the contact 3 deforms elastically such that the contact portion 310 firmly electrically connects with the CPU 7. Thus, the LGA connector 1 electrically connects the CPU 7 with the PCB 5. In this state, the stand-offs 220 withstand the pressure applied from the retention module, to protect the solder balls 34 from excessive pressure and damage.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A land grid array (LGA) connector assembly comprising:
   a printed circuit board;
   an LGA socket seated upon the printed circuit board, said socket including an insulative housing defining a cavity in a middle thereof and a plurality of passageways in a portion thereof under the cavity, each passageway including a slot, the housing having a plurality of stand-offs at two sides thereof;
   a plurality of contacts received and vertically floatable in the corresponding passageways, respectively, each of said contacts connected to the printed circuit board via a corresponding solder ball and having an upper tip substantially hidden under a top face of the housing;
   wherein each contact comprising a long arm accommodated within the passageway and an engaging portion for movably engaging with the housing in the slot, said long arm has a contact portion at a free end thereof and said engaging portion has a plurality of protrusions engaging the slot;
   wherein said stand-offs are formed on an underside of the housing and vertically keep a distance from the printed circuit board while the housing is pushable dowardly to move the contacts upwardly in corresponding slots of the passageways relatively to the housing.

2. The LGA connector as claimed in claim 1, wherein there are three stand-offs at the bottom of the housing, and two of the stand-offs at one side of the bottom are parallel to another stand-offs at the opposite side of the bottom.

3. A method of assembling an LGA (Land Grid Array) package to an LGA socket, comprising:
   providing a printed circuit board;
   providing the LGA socket with an insulative housing defining a plurality of passageways, respectively;
   disposing a plurality of contacts in the corresponding passageways, respectively, in a floatable manner;
   providing said housing with a plurality of standoffs on an undersurface thereof;
   soldering the contacts to the printed circuit board via corresponding solder balls under a condition that the standoffs are vertically spaced from the printed circuit board and upper tips of the contacts are substantially hidden under a top face of the housing; and
   loading the LGA package unto the housing to not only abut against the successively exposed upper tips of the contacts but also presses the top face to downwardly move the housing until the standoffs are seated upon printed circuit board.

* * * * *